(12) United States Patent
Li

(10) Patent No.: US 8,944,538 B2
(45) Date of Patent: Feb. 3, 2015

(54) ELECTRONIC DEVICE ENCLOSURE WITH HANDLE

(71) Applicants: Hong Fu Jin Precision Industry (ShenZhen) Co., Ltd., Shenzhen (CN); Hon Hai Precision Industry Co., Ltd., New Taipei (TW)

(72) Inventor: Zhan-Yang Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 14/035,971

(22) Filed: Sep. 25, 2013

(65) Prior Publication Data

US 2014/0191636 A1    Jul. 10, 2014

(30) Foreign Application Priority Data

Jan. 10, 2013  (CN) .......................... 2013 1 0008713

(51) Int. Cl.
   *H05K 5/00*    (2006.01)
   *H05K 5/02*    (2006.01)
(52) U.S. Cl.
   CPC .................................. *H05K 5/0221* (2013.01)
   USPC ................. 312/332.1; 312/223.2; 361/679.59
(58) Field of Classification Search
   CPC ...... H05K 7/1411; H05K 5/023; G06F 1/181; G06F 1/187; E05B 35/008; E05C 3/042
   USPC ........ 312/330.1, 332.1, 223.2, 215, 222, 244; 361/724–727, 679.59; 70/58; 292/336.3, 194, 195, 219, 220, 228, 292/198, 202, DIG. 37
   See application file for complete search history.

(56) References Cited

U.S. PATENT DOCUMENTS

| 2,062,417 | A  | * | 12/1936 | Jay .................................. 109/47 |
| 3,736,051 | A  | * | 5/1973  | Conner et al. .................. 352/72 |
| 6,178,086 | B1 | * | 1/2001  | Sim et al. ................. 361/679.59 |
| 6,676,176 | B1 | * | 1/2004  | Quandt ......................... 292/202 |
| 6,952,341 | B2 | * | 10/2005 | Hidaka et al. ............ 361/679.32 |
| 7,480,137 | B1 | * | 1/2009  | Jyh ........................... 361/679.33 |
| 7,511,953 | B2 | * | 3/2009  | Tao et al. .................. 361/679.39 |
| 7,558,075 | B2 | * | 7/2009  | Nguyen et al. ................ 361/801 |
| 7,586,748 | B2 | * | 9/2009  | Chen ............................. 361/727 |
| 8,247,690 | B2 | * | 8/2012  | Wang et al. ..................... 174/50 |
| 8,336,931 | B2 | * | 12/2012 | Cotton et al. ................. 292/252 |
| 8,434,833 | B2 | * | 5/2013  | Hsu et al. ................... 312/223.2 |
| 8,789,901 | B2 | * | 7/2014  | Kuan ......................... 312/223.2 |
| 2005/0105269 | A1 | * | 5/2005  | Chen et al. .................... 361/695 |
| 2011/0074259 | A1 | * | 3/2011  | Chen ......................... 312/223.2 |
| 2011/0273850 | A1 | * | 11/2011 | Chen ............................ 361/726 |
| 2012/0293975 | A1 | * | 11/2012 | Liang ........................... 361/807 |
| 2013/0127311 | A1 | * | 5/2013  | Chiu et al. .................... 312/236 |
| 2014/0184040 | A1 | * | 7/2014  | Li .............................. 312/223.1 |
| 2014/0191635 | A1 | * | 7/2014  | Li .............................. 312/223.1 |

\* cited by examiner

*Primary Examiner* — Janet M Wilkens
(74) *Attorney, Agent, or Firm* — Novak Druce Connolly Bove + Quigg LLP

(57) ABSTRACT

An electronic device enclosure includes a chassis, a cover secured to the chassis, a handle rotatably mounted to the chassis, a latching member rotatably mounted to the chassis and securing the handle to the chassis, and a resilient member mounted between the latching member and the cover. The latching member comprises a pressing portion extending out of the cover. The pressing portion is operable to be pressed to rotate the latching member to disengage from the chassis and elastically press the resilient member, allowing the handle to rotate relative to the chassis without pulling out the handle forcefully by hand.

20 Claims, 5 Drawing Sheets

ELECTRONIC DEVICE ENCLOSURE WITH HANDLE

BACKGROUND

1. Technical Field

The present disclosure relates to an electronic device enclosure, and particularly to an electronic device enclosure with a handle.

2. Description of Related Art

Electronic equipment, such as servers, may contain heavy electronic modules, such as power supplies and fan modules. The heavy electronic modules are secured in an enclosure of the electronic equipment. A handle may be rotatably mounted to the enclosure by a rotating shaft for conveniently moving the enclosure. However, when moving the enclosure, the handle often needs to be pulled out forcefully. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
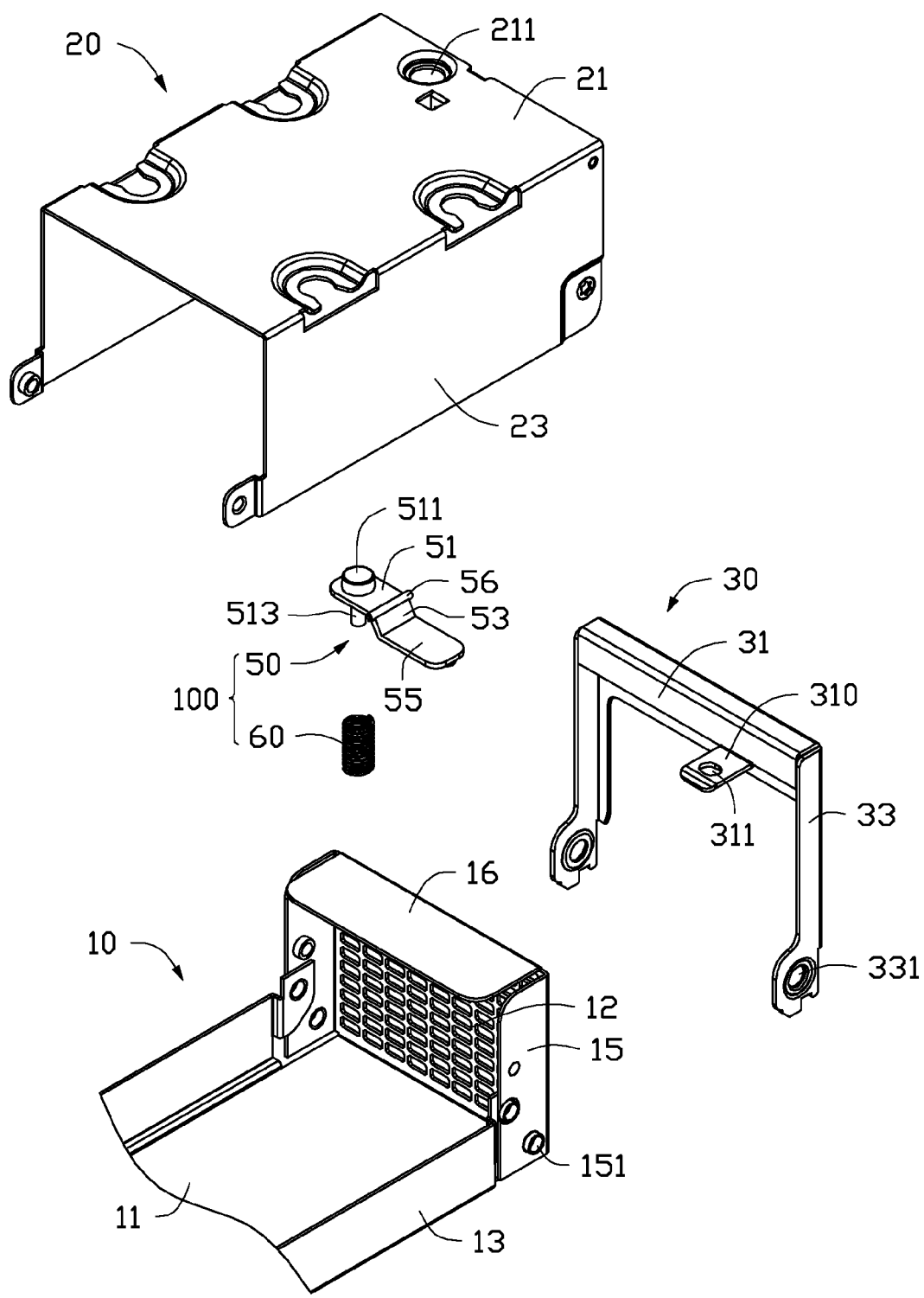
FIG. 1 is an exploded, isometric view of one embodiment of an electronic device enclosure.
Figure 2:
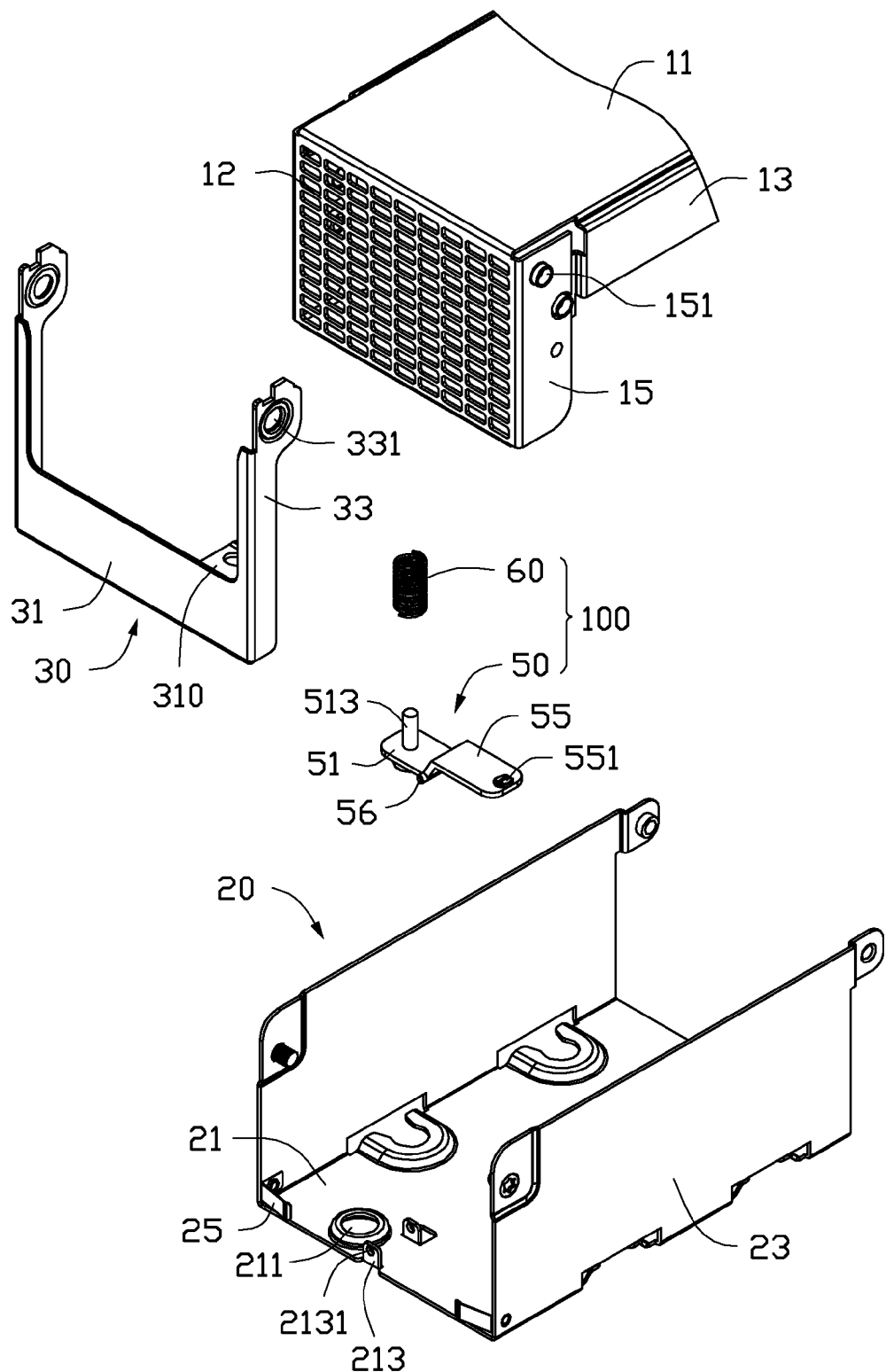
FIG. 2 is similar to FIG. 1, but viewed from a different aspect.

FIG. 1 and FIG. 2 show one embodiment of an electronic device enclosure for securing an electronic module (not shown). The electronic device enclosure includes a chassis 10, a cover 20, a handle 30, and a securing assembly 100.

The chassis 10 includes a bottom plate 11, a front plate 12, and two side plates 13. The two side plates 13 are opposite to each other. In this embodiment, the bottom plate 11 is substantially perpendicular to the front plate 12 and the side plates 13, and the front plate 12 is substantially perpendicular to the side plates 13. Two flanges 15 extend from opposite side edges of the front plate 12, respectively. The flanges 15 are substantially perpendicular to the bottom plate 11. Each flange 15 is riveted to a corresponding side plate 13. A holding plate 16 extends from a top edge of the front plate 12, which is substantially parallel to bottom plate 11. In this embodiment, the flanges 15 are substantially parallel to each side plate 13, and the holding plate 16 is substantially perpendicular to bottom plate 11. A pivoting shaft 151 is located on the flange 15.

The cover 20 includes a top wall 21 and two sidewalls 23. The top wall 21 defines a through hole 211. A pair of pivoting pieces 213 extends from a bottom surface of the top wall 21. Each pivoting piece 213 defines a pivoting hole 2131. In this embodiment, the top wall 21 is substantially perpendicular to each sidewall 23, and each pivoting piece 213 is substantially perpendicular to the top wall 21 and the sidewall 23. A resilient piece 25 extends from each sidewall 23. The resilient piece 25 extends slantingly out of the cover 20.

The handle 30 includes a mounting plate 31 and two rotating arms 33 connected to the mounting plate 31. A latching piece 310 is secured to the mounting plate 31. The latching piece 310 defines a latching slot 311. The latching slot 311 extends from a side edge of the latching piece 310. Each rotating arm 33 defines a pivoting hole 331. In this embodiment, the latching piece 310 is substantially perpendicular to the mounting plate 31.

The securing assembly 100 includes a latching member 50 and a resilient member 60.

The latching member 50 includes a holding piece 51, a connecting piece 53, and a limiting piece 55. The holding piece 51 and the limiting piece 55 extend from opposite edges of the connecting piece 53. The connecting piece 53 is slanted relative to the holding piece 51 and the limiting piece 55. In one embodiment, the holding piece 51 is substantially parallel to the limiting piece 55. A pressing portion 511 extends from a top surface of the holding piece 51. A positioning post 513 extends from a bottom surface of the holding piece 51. The pressing portion 511 is received in the through hole 211. A pivoting shaft 56 is located in an intersection of the holding piece 51 and the connecting piece 53. A limiting block 551 extends downwards from the limiting piece 55.

In this embodiment, the resilient member 60 is a coiled spring and a compression spring.

Figure 3:
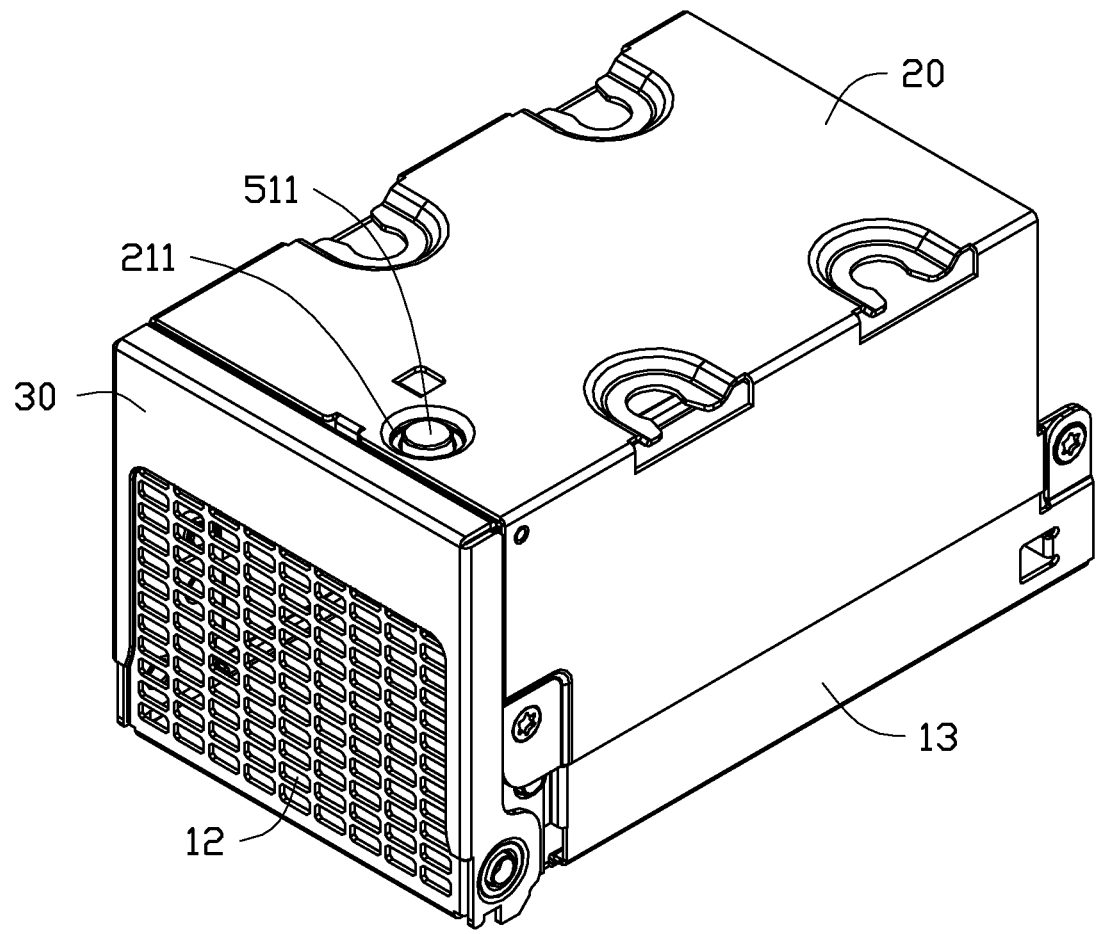
FIG. 3 is an assembled, isometric view of the electronic device enclosure of FIG. 1, with a handle in a closed position.
Figure 4:
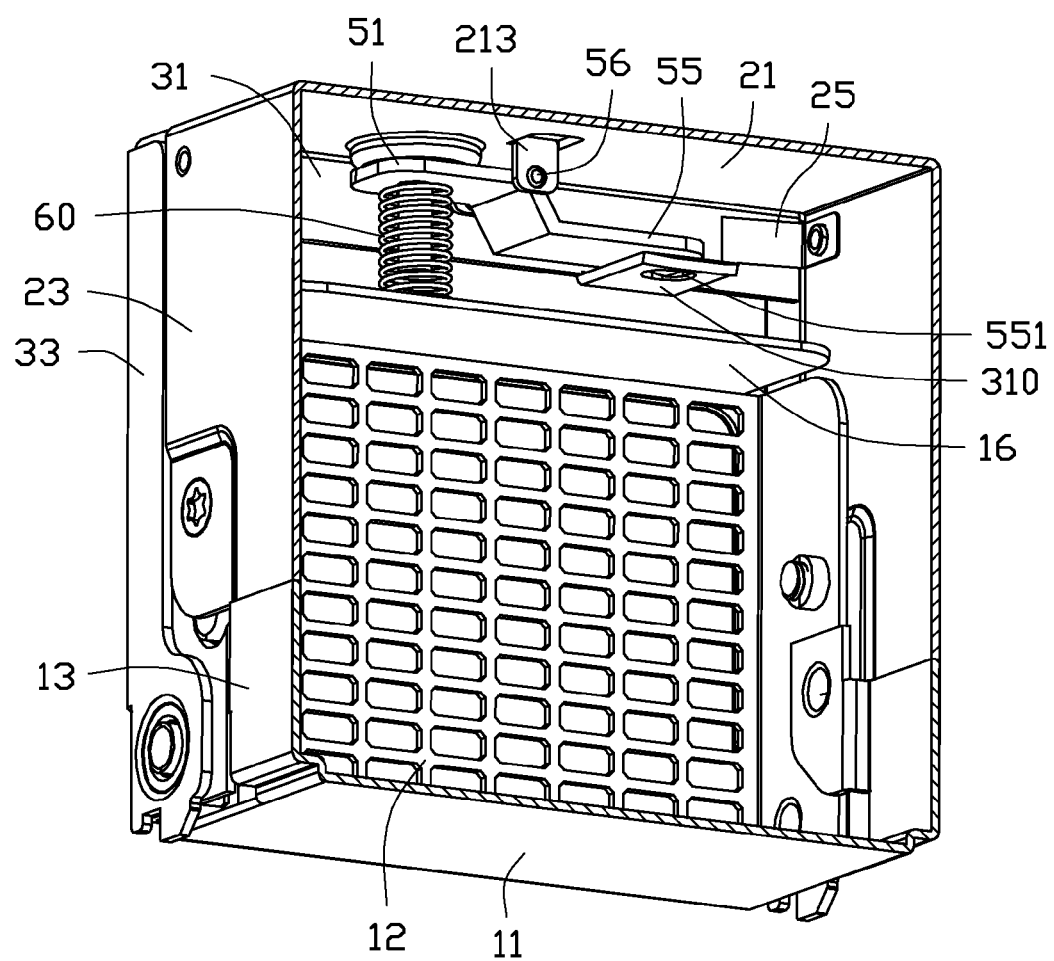
FIG. 4 is similar to FIG. 3, with a chassis and a cover partially cut.

FIG. 3 and FIG. 4 show that in assembly, the resilient member 60 is placed on the holding plate 16. The positioning post 513 is inserted in the resilient member 60. Each end of the pivoting shaft 56 is pivotably received in the pivoting hole 2131 by elastically deforming the pivoting pieces 213. The pressing portion 511 extends out of the top wall 21 through the through hole 211. The cover 20 covers the chassis 10. The sidewall 23 is secured to the flange 15 by riveting, soldering, or other securing methods. The cover 20 covers the chassis 10. The top wall 21 is substantially parallel to the holding plate 16. A first end of the resilient member 60 abuts a bottom surface of the holding piece 51, and a second end of the resilient member 60 abuts the holding plate 16. Thus, when the pressing portion 511 is pressed downwards, the latching member 50 is rotated about the pivoting shaft 56 to press the resilient member 60. The pivoting shaft 56 is substantially parallel to the top wall 21 and the sidewall 23. The pivoting shaft 151 is inserted through the pivoting hole 331, to rotatably mount the rotating arm 33 to the flange 15. In this position, the resilient member 60 and the latching member 50 are in an initial position.

In assembly of the handle 30, the handle 30 is rotated towards the holding plate 16, until blocked by the limiting block 551. The handle 30 is further rotated to rotate the limiting piece 55 away from the holding plate 16. The holding piece 51 is rotated towards the holding plate 16 and elastically deform the resilient member 60. When the limiting block 551 is aligned with the latching hole 311, the mounting plate 31 resists and elastically deforms the resilient piece 25, the handle 30 is released, the resilient member 60 rebounds to engage the limiting block 551 in the latching hole 311, to secure the handle 30 to the chassis 10. In this position, the latching member 50 is in a closed position, and the limiting piece 55 is substantially parallel to the latching piece 310.

Figure 5:
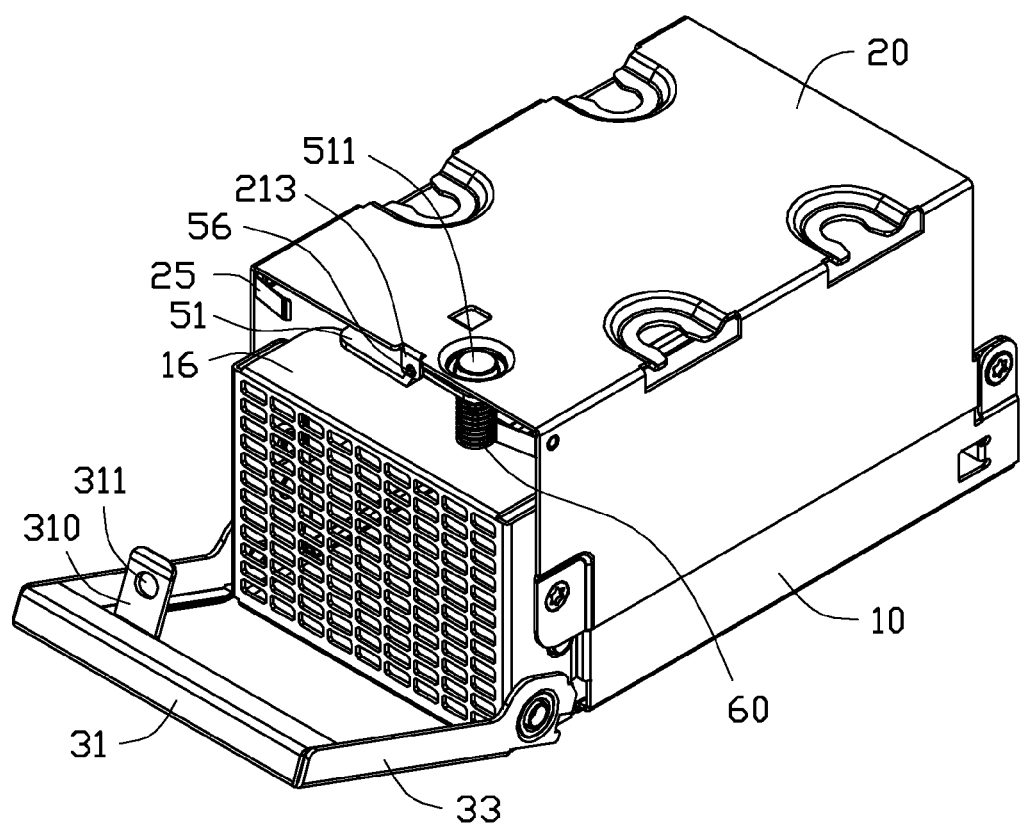
FIG. 5 is another assembled, isometric view of the electronic device enclosure of FIG. 1, with the handle in an open position.

FIG. 5 shows that to open the handle 30, the pressing portion 511 is pressed downwards to rotate the holding piece 51 towards the holding plate 16 and elastically deform the resilient member 60. At the same time, the limiting piece 55 is rotated away from the holding plate 16, until the limiting block 551 is disengaged from the latching hole 311. The resilient member 25 rebounds to extend the mounting plate 31 outwards, thereby releasing the handle 30 from the cover 20, and the operation member 50 is in an open position.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and the arrangement of parts within the principles of the disclosure, to the full extent indicated by the broad general meaning of the terms in which the appended claims are expressed.

What is claimed is:

1. An electronic device enclosure, comprising:
    a chassis;
    a cover secured to the chassis;
    a handle rotatably mounted to the chassis and comprising a latching piece;
    a latching member rotatably mounted to the cover and comprising a limiting piece and a pressing portion extending out of the cover; and
    a resilient member mounted between the chassis and the latching member;
    wherein the latching piece is engaged with the limiting piece, preventing the handle from rotating relative to the chassis; the pressing portion is operable to be pressed to rotate the latching member relative to the chassis to disengage the latching piece from the limiting piece and elastically press the resilient member, allowing the handle to rotate relative to the chassis.

2. The electronic device enclosure of claim 1, wherein the latching member further comprises a holding piece and a connecting piece; the holding piece and the latching piece extend from opposite edges of the connecting piece; and the holding piece abuts the resilient member.

3. The electronic device enclosure of claim 2, wherein the connecting piece is slanted relative to the holding piece and the latching piece, and the holding piece is substantially parallel to the latching piece.

4. The electronic device enclosure of claim 2, wherein the latching member further comprises a positioning post, and the pressing portion and the limiting post are located on opposite sides of the holding piece; and the cover defines a through hole, and the pressing portion extends through the through hole.

5. The electronic device enclosure of claim 2, wherein the cover comprises a top wall and a sidewall; the chassis comprises a bottom plate, a side plate, and a holding plate; the bottom plate is substantially parallel to the holding plate; the top wall is substantially parallel to the bottom plate; the sidewall is secured to the side plate; and a first end of the resilient member abuts the holding plate, and a second end of the resilient member abuts the holding piece.

6. The electronic device enclosure of claim 5, wherein each of the holding piece, the connecting piece, and the latching piece is located between the top wall and the holding plate.

7. The electronic device enclosure of claim 2, wherein the cover further comprises two pivoting pieces extending from the top wall, and each pivoting piece defines a pivoting hole; the latching member further comprises a pivoting shaft, and each end of the pivoting shaft is pivotably received in the pivoting hole.

8. The electronic device enclosure of claim 7, wherein each pivoting piece is substantially perpendicular to the top wall, and the pivoting shaft is substantially parallel to the top wall and the sidewall.

9. The electronic device enclosure of claim 1, wherein the latching member further comprises a limiting block in the limiting piece, the latching piece defines a latching hole, and the limiting block is engaged in the latching hole; and when the pressing portion is pressed downwards, the limiting block is disengaged from the latching hole.

10. The electronic device enclosure of claim 1, wherein the cover further comprises a resilient piece, and the resilient piece is elastically deformed to resist the handle; and when the pressing portion is pressed downwards, the resilient piece rebounds to rotate the handle away from the chassis.

11. An electronic device enclosure, comprising:
    a chassis;
    a cover secured to the chassis and comprising a resilient piece member;
    a handle rotatably mounted to the chassis and comprising a latching piece;
    a latching member rotatably mounted to the cover and comprising a limiting piece and a pressing portion extending out of the cover; and
    a resilient member mounted between the chassis and the latching member;
    wherein the resilient member is elastically deformed to resist the handle, and the latching piece is engaged with the limiting piece, preventing the handle from rotating relative to the chassis; the pressing portion is operable to be pressed to rotate the latching member relative to the chassis to disengage the latching piece from the limiting piece and elastically press the resilient member, and the resilient piece rebounds to rotate the handle away from the chassis.

12. The electronic device enclosure of claim 11, wherein the latching member further comprises a holding piece and a connecting piece; the holding piece and the latching piece extend from opposite edges of the connecting piece; and the holding piece abuts the resilient member.

13. The electronic device enclosure of claim 12, wherein the connecting piece is slanted relative to the holding piece and the latching piece, and the holding piece is substantially parallel to the latching piece.

14. The electronic device enclosure of claim 12, wherein the latching member further comprises a positioning post, and the pressing portion and the limiting post are located on opposite sides of the holding piece; and the cover defines a through hole, and the pressing portion extends through the through hole.

15. The electronic device enclosure of claim 12, wherein the cover comprises a top wall and a sidewall; the chassis comprises a bottom plate, a side plate, and a holding plate; the bottom plate is substantially parallel to the holding plate; the top wall is substantially parallel to the bottom plate; the sidewall is secured to the side plate; and a first end of the resilient member abuts the holding plate, and a second end of the resilient member abuts the holding piece.

16. The electronic device enclosure of claim 15, wherein each of the holding piece, the connecting piece, and the latching piece is located between the top wall and the holding plate.

17. The electronic device enclosure of claim 12, wherein the cover further comprises two pivoting pieces extending from the top wall, and each pivoting piece defines a pivoting hole; the latching member further comprises a pivoting shaft, and each end of the pivoting shaft is pivotably received in the pivoting hole.

18. The electronic device enclosure of claim 17, wherein each pivoting piece is substantially perpendicular to the top wall.

19. The electronic device enclosure of claim 17, wherein the pivoting shaft is substantially parallel to the top wall and the sidewall.

20. The electronic device enclosure of claim 11, wherein the latching member further comprises a limiting block in the limiting piece, the latching piece defines a latching hole, and the limiting block is engaged in the latching hole; and when the pressing portion is pressed downwards, the limiting block is disengaged from the latching hole.

* * * * *